(12) United States Patent
Gee et al.

(10) Patent No.: US 9,583,701 B1
(45) Date of Patent: Feb. 28, 2017

(54) METHODS FOR FABRICATING RESISTIVE MEMORY DEVICE SWITCHING MATERIAL USING ION IMPLANTATION

(71) Applicant: Crossbar, Inc., Santa Clara, CA (US)

(72) Inventors: Harry Yue Gee, Milpitas, CA (US);
Steven Patrick Maxwell, Sunnyvale, CA (US); Natividad Vasquez, Jr., San Francisco, CA (US); Mark Harold Clark, Santa Clara, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/213,953

(22) Filed: Mar. 14, 2014

Related U.S. Application Data

(63) Continuation-in-part of application No. 14/034,390, filed on Sep. 23, 2013, which is a continuation of
(Continued)

(51) Int. Cl.
*H01L 45/00* (2006.01)

(52) U.S. Cl.
CPC ........ *H01L 45/1266* (2013.01); *H01L 45/165* (2013.01)

(58) Field of Classification Search
CPC ............................ H01L 45/1253; H01L 45/16
See application file for complete search history.

(56) References Cited

U.S. PATENT DOCUMENTS

| 680,652 A | 8/1901 | Leonard |
|---|---|---|
| 4,433,468 A | 2/1984 | Kawamata |

(Continued)

FOREIGN PATENT DOCUMENTS

| CN | 101131872 A | 2/2008 |
|---|---|---|
| CN | 101170132 | 4/2008 |

(Continued)

OTHER PUBLICATIONS

Office Action mailed Oct. 9, 2012 for U.S. Appl. No. 13/417,135, 14 pages.
(Continued)

*Primary Examiner* — Whitney T Moore
*Assistant Examiner* — Joseph Galvin, III
(74) *Attorney, Agent, or Firm* — Amin, Turocy & Watson, LLP

(57) ABSTRACT

A memory device comprising a doped conductive polycrystalline layer having an electrically resistive portion, is described herein. By way of example, ion implantation to a subset of the conductive polycrystalline layer can degrade and modify the polycrystalline layer, forming the electrically resistive portion. The electrically resistive portion can include resistive switching properties facilitating digital information storage. Parametric control of the ion implantation can facilitate control over corresponding resistive switching properties of the resistive portion. For example, a projected range or depth of the ion implantation can be controlled, allowing for preferential placement of atoms in the resistive portion, and fine-tuning of a forming voltage of the memory device. As another example, dose and number of atoms implanted, type of atoms or ions that are implanted, the conductive polycrystalline material used, and so forth, can facilitate control over switching characteristics of the memory device.

20 Claims, 8 Drawing Sheets

Related U.S. Application Data application No. 13/585,759, filed on Aug. 14, 2012, now Pat. No. 8,569,172.

(60) Provisional application No. 61/789,888, filed on Mar. 15, 2013.

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Sastry et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |

(56) References Cited

U.S. PATENT DOCUMENTS

| | | |
|---|---|---|
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Sastry et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea |
| 8,274,812 B2 | 9/2012 | Nazarian et al. |
| 8,305,793 B2 | 11/2012 | Majewski et al. |
| 8,315,079 B2 | 11/2012 | Kuo et al. |
| 8,320,160 B2 | 11/2012 | Nazarian |
| 8,351,241 B2 | 1/2013 | Lu |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik |
| 8,467,226 B2 | 6/2013 | Bedeschi et al. |
| 8,467,227 B1 | 6/2013 | Jo |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee |
| 8,854,859 B2 | 10/2014 | Chung |
| 8,934,294 B2 | 1/2015 | Kim et al. |
| 8,946,667 B1 | 2/2015 | Clark |
| 8,946,673 B1 | 2/2015 | Kumar |
| 8,947,908 B2 | 2/2015 | Jo |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu et al. |
| 2006/0028895 A1 | 2/2006 | Taussig et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek |
| 2006/0231910 A1* | 10/2006 | Hsieh ............... H01L 21/28052 257/413 |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner et al. |
| 2007/0090425 A1 | 4/2007 | Kumar et al. |
| 2007/0091685 A1 | 4/2007 | Guterman et al. |
| 2007/0105284 A1 | 5/2007 | Herner et al. |
| 2007/0105390 A1 | 5/2007 | Oh |
| 2007/0133250 A1 | 6/2007 | Kim |
| 2007/0133270 A1 | 6/2007 | Jeong |
| 2007/0159869 A1 | 7/2007 | Baek et al. |
| 2007/0159876 A1 | 7/2007 | Sugibayashi |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1* | 1/2009 | Lu ..................... H01L 27/2472 257/4 |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |

(56) References Cited

U.S. PATENT DOCUMENTS

| | | |
|---|---|---|
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1* | 2/2012 | Wang .................. G11C 13/0007 365/148 |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1* | 9/2012 | Zhang .................. B82Y 10/00 365/148 |
| 2012/0235112 A1 | 9/2012 | Huo et al. |
| 2012/0236625 A1 | 9/2012 | Ohba et al. |
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |

(56) References Cited

U.S. PATENT DOCUMENTS

| | | | |
|---|---|---|---|
| 2014/0177315 | A1 | 6/2014 | Pramanik et al. |
| 2014/0192589 | A1 | 7/2014 | Maxwell et al. |
| 2014/0197369 | A1 | 7/2014 | Sheng et al. |
| 2014/0233294 | A1 | 8/2014 | Ting et al. |
| 2014/0264236 | A1 | 9/2014 | Kim et al. |
| 2014/0264250 | A1 | 9/2014 | Maxwell et al. |
| 2014/0268997 | A1 | 9/2014 | Nazarian et al. |
| 2014/0268998 | A1 | 9/2014 | Jo |
| 2014/0269002 | A1 | 9/2014 | Jo |
| 2014/0312296 | A1 | 10/2014 | Jo et al. |
| 2014/0335675 | A1 | 11/2014 | Narayanan |
| 2015/0070961 | A1 | 3/2015 | Katayama et al. |
| 2015/0228334 | A1 | 8/2015 | Nazarian et al. |
| 2016/0111640 | A1 | 4/2016 | Chang et al. |

FOREIGN PATENT DOCUMENTS

| | | |
|---|---|---|
| CN | 101501850 | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005506703 A | 3/2005 |
| JP | 2006032951 A | 2/2006 |
| JP | 2007067408 A | 3/2007 |
| JP | 2007281208 A | 10/2007 |
| JP | 2007328857 A | 12/2007 |
| JP | 2008503085 | 1/2008 |
| JP | 2008147343 | 6/2008 |
| JP | 2009043873 | 2/2009 |
| JP | 2011023645 A | 2/2011 |
| JP | 2011065737 | 3/2011 |
| JP | 2012504840 | 2/2012 |
| JP | 2012505551 | 3/2012 |
| JP | 2012089567 | 5/2012 |
| JP | 2012533195 | 12/2012 |
| KR | 20090051206 A | 5/2009 |
| KR | 20110014248 A | 2/2011 |
| WO | WO03034498 A1 | 4/2003 |
| WO | 2005124787 | 12/2005 |
| WO | WO2009005699 A1 | 1/2009 |
| WO | 2010026654 | 3/2010 |
| WO | 2010042354 | 4/2010 |
| WO | 2010042732 | 4/2010 |
| WO | 2011008654 | 1/2011 |
| WO | WO2011005266 A1 | 1/2011 |
| WO | WO2011133138 A1 | 10/2011 |

OTHER PUBLICATIONS

Office Action mailed Jan. 10, 2014 for U.S. Appl. No. 13/920,021, 34 pages.
Office Action mailed Apr. 11, 2014 for U.S. Appl. No. 13/143,047, 21 pages.
Office Action mailed Feb. 11, 2014 for U.S. Appl. No. 13/620,012, 54 pages.
Office Action mailed Jul. 11, 2013 for U.S. Appl. No. 13/764,698, 14 pages.
Office Action mailed Sep. 11, 2014 for U.S. Appl. No. 13/739,283, 32 pages.
Office Action mailed Aug. 12, 2013 for U.S. Appl. No. 13/077,941, 64 pages.
Office Action mailed Mar. 12, 2014 for U.S. Appl. No. 13/167,920, 23 pages.
Office Action mailed Sep. 12, 2014 for U.S. Appl. No. 13/426,869, 25 pages.
Office Action mailed Sep. 12, 2014 for U.S. Appl. No. 13/756,498, 43 pages.
Office Action mailed Feb. 13, 2014 for U.S. Appl. No. 13/174,077, 21 pages.
Office Action mailed Mar. 14, 2012 for U.S. Appl. No. 12/815,369, 18 pages.
Office Action mailed Mar. 14, 2014 for U.S. Appl. No. 12/835,704, 19 pages.
Office Action mailed Apr. 16, 2012 for U.S. Appl. No. 12/834,610, 23 pages.
Office Action mailed Jan. 16, 2014 for U.S. Appl. No. 13/739,283, 37 pages.
Office Action mailed May 16, 2012 for U.S. Appl. No. 12/815,318, 25 pages.
Office Action mailed Oct. 16, 2012 for U.S. Appl. No. 12/861,650, 29 pages.
Office Action mailed Apr. 17, 2012 for U.S. Appl. No. 12/814,410, 17 pages.
Office Action mailed Feb. 17, 2011 for U.S. Appl. No. 12/913,719, 17 pages.
Office Action mailed Apr. 19, 2011 for U.S. Appl. No. 12/582,086, 29 pages.
Office Action mailed Aug. 19, 2013 for U.S. Appl. No. 13/585,759, 15 pages.
Office Action mailed Jun. 19, 2012 for U.S. Appl. No. 13/149,757, 11 pages.
Office Action mailed Mar. 19, 2013 for U.S. Appl. No. 13/465,188, 13 pages.
Office Action mailed Mar. 19, 2013 for U.S. Appl. No. 13/564,639, 25 pages.
Office Action mailed May 20, 2013 for U.S. Appl. No. 13/725,331, 28 pages.
Office Action mailed Nov. 20, 2012 for U.S. Appl. No. 13/149,653, 50 pages.
Office Action mailed Sep. 20, 2013 for U.S. Appl. No. 13/481,600, 25 pages.
Office Action mailed Mar. 21, 2014 for U.S. Appl. No. 13/447,036, 27 pages.
Office Action mailed May 21, 2014 for U.S. Appl. No. 13/764,698, 31 pages.
Office Action mailed Sep. 21, 2011 for U.S. Appl. No. 12/835,704, 19 pages.
Office Action mailed Jul. 22, 2010 for U.S. Appl. No. 11/875,541, 29 pages.
Office Action mailed Jul. 22, 2011 for U.S. Appl. No. 12/913,719, 13 pages.
Office Action mailed Sep. 22, 2014 for U.S. Appl. No. 13/189,401, 26 pages.
Office Action mailed May 23, 2013 for U.S. Appl. No. 13/592,224, 21 pages.
Office Action mailed Aug. 24, 2011 for U.S. Appl. No. 12/835,699, 16 pages.
Office Action mailed Apr. 25, 2012 for U.S. Appl. No. 13/149,653, 25 pages.
Office Action mailed Apr. 25, 2014 for U.S. Appl. No. 13/761,132, 28 pages.
Office Action mailed Jan. 25, 2012 for U.S. Appl. No. 12/861,650, 20 pages.
Office Action mailed Sep. 25, 2013 for U.S. Appl. No. 13/194,479, 25 pages.
Office Action mailed Nov. 26, 2012 for U.S. Appl. No. 13/156,232, 22 pages.
Office Action mailed Aug. 27, 2013 for U.S. Appl. No. 13/436,714, 20 pages.
Office Action mailed Dec. 27, 2013 for U.S. Appl. No. 13/525,096, 23 pages.
Office Action mailed Mar. 27, 2012 for U.S. Appl. No. 13/314,513, 7 pages.
Office Action mailed Mar. 13, 2012 for U.S. Appl. No. 12/625,817, 27 pages.
Office Action mailed Jan. 29, 2014 for U.S. Appl. No. 13/586,815, 41 pages.
Office Action mailed Jul. 29, 2013 for U.S. Appl. No. 13/466,008, 27 pages.
Office Action mailed Mar. 29, 2013 for U.S. Appl. No. 12/861,432, 33 pages.

(56) References Cited

OTHER PUBLICATIONS

Office Action mailed Jul. 30, 2012 for U.S. Appl. No. 12/900,232, 13 pages.
Office Action mailed Jun. 30, 2014 for U.S. Appl. No. 13/531,449, 19 pages.
Office Action mailed Mar. 30, 2011 for U.S. Appl. No. 11/875,541, 17 pages.
Jo S.H., et al., "Experimental, Modeling and Simulation Studies of Nanoscale Resistance Switching Devices", Conference on Nanotechnology, IEEE, 2009, pp. 493-495.
Jo S.H., et al., "High-Density Crossbar Arrays Based on a Si Memristive System," Nano Letters, 2009, vol. 9 (2), pp. 870-874.
Jo S.H. et al., "High-Density Crossbar Arrays Based on a Si Memristive System", Supporting Information, 2009, pp. 1-4.
Jo S.H., et al., "Si Memristive Devices Applied to Memory and Neuromorphic Circuits", Proceedings of 2010 IEEE International Symposium on Circuits and Systems, 2010, pp. 13-16.
Jo S.H., et al., "Si-Based Two-Terminal Resistive Switching Nonvolatile Memory", IEEE, 2008.
Jo S.H., et al., "Nanoscale Memristive Devices for Memory and Logic Applications", Ph. D Dissertation, University of Michigan, 2010.
Jo S.H., et al., "Nanoscale Memristor Device as Synapse in Neuromorphic Systems," Nano Letters, 2010, vol. 10, pp. 1297-1301.
Jo S.H., et al., "Nonvolatile Resistive Switching Devices Based on Nanoscale Metal/Amorphous Silicon/Crystalline Silicon Junctions," Materials Research Society Symposium Proceedings, 2007, vol. 997.
Jo S.H., et al., "Programmable Resistance Switching in Nanoscale Two-Terminal Devices," Nano Letters, 2009, vol. 9 (1), pp. 496-500.
Jo S.H., et al., "Programmable Resistance Switching in Nanoscale Two-Terminal Devices," Supporting Information, 2009, pp. 1-4.
Kim et al., "Nanoscale Resistive Memory with Intrinsic Diode Characteristics and Long Endurance," Applied Physics Letters, 2010, vol. 96, pp. 053106-1-053106-3.
Kund M., et al., "Conductive Bridging Ram (cbram): An Emerging Non-volatile Memory Technology Scalable to Sub 20nm", IEEE, 2005.
Le Comber P.G., at al., "The Switching Mechanism in Amorphous Silicon Junctions," Journal of Non-Crystalline Solids, 1985, vol. 77 & 78, pp. 1373-1382.
Le Comber P.G., "Present and Future Applications of Amorphous Silicon and Its Alloys," Journal of Non-Crystalline Solids, 1989, vol. 115, pp. 1-13.
Lee S.H., et al., "Full Integration and Cell Characteristics for 64Mb Nonvolatile PRAM", 2004 Symposium on VLSI Technology Digest of Technical Papers, IEEE, 2004, pp. 20-21.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Lu W., et al., "Nanoelectronics from the Bottom Up," Nature Materials, 2007, vol. 6, pp. 841-850.
Lu W., et al., "Supporting Information", 2008.
Marand H., et al., MESc. 5025 lecture notes: Chapter 7. Diffusion, University of Vermont. Retrieved from the Internet on May 10, 2016.
Moopenn A. et al., "Programmable Synaptic Devices for Electronic Neural Nets," Control and Computers, 1990, vol. 18 (2), pp. 37-41.
Muller D.A., et al., "The Electronic Structure at the Atomic Scale of Ultrathin Gate Oxides," Nature, 1999, vol. 399, pp. 758-761.
Muller G., et al., "Status and Outlook of Emerging Nonvolatile Memory Technologies", IEEE, 2004, pp. 567-570.
Newman R.C., "Defects in Silicon," Reports on Progress in Physics, 1982, vol. 45, pp. 1163-1210.
Notice of Allowance mailed Sep. 4, 2014 for U.S. Appl. No. 13/761,132, 6 pages.
Notice of Allowance mailed Oct. 5, 2011 for U.S. Appl. No. 12/940,920, 8 pages.
Notice of Allowance mailed Feb. 6, 2012 for U.S. Appl. No. 12/835,699, 7 pages.
Notice of Allowance mailed Feb. 6, 2013 for U.S. Appl. No. 13/118,258, 9 pages.
Notice of Allowance mailed Aug. 8, 2013 for U.S. Appl. No. 13/733,828, 9 pages.
Notice of Allowance mailed Jan. 8, 2013 for U.S. Appl. No. 12/814,410, 8 pages.
Notice of Allowance mailed Oct. 8, 2013 for U.S. Appl. No. 13/769,152, 9 pages.
Notice of Allowance mailed Oct. 8, 2013 for U.S. Appl. No. 13/905,074, 10 pages.
Notice of Allowance mailed Apr. 9, 2013 for U.S. Appl. No. 13/748,490, 8 pages.
Corrected Notice of Allowability mailed Sep. 9, 2014 for U.S. Appl. No. 13/620,012, 2 pages.
Notice of Allowance mailed Sep. 9, 2014 for U.S. Appl. No. 13/870,919, 5 pages.
Notice of Allowance mailed Oct. 10, 2013 for U.S. Appl. No. 13/452,657, 10 pages.
Supplemental Notice of Allowability mailed Jan. 11, 2013 for U.S. Appl. No. 12/894,087, 2 pages.
Notice of Allowance mailed May 11, 2012 for U.S. Appl. No. 12/939,824, 8 pages.
Notice of Allowance mailed Mar. 12, 2012 for U.S. Appl. No. 12/913,719, 5 pages.
Notice of Allowance mailed Nov. 13, 2013 for U.S. Appl. No. 13/461,725, 10 pages.
Notice of Allowance mailed Nov. 14, 2012 for U.S. Appl. No. 12/861,666, 5 pages.
Notice of Allowance mailed Nov. 14, 2012 for U.S. Appl. No. 13/532,019, 8 pages.
Notice of Allowance mailed Mar. 15, 2013 for U.S. Appl. No. 12/894,098, 12 pages.
Notice of Allowance mailed Oct. 16, 2013 for U.S. Appl. No. 13/174,264, 7 pages.
Notice of Allowance mailed Apr. 17, 2012 for U.S. Appl. No. 13/158,231, 7 pages.
Notice of Allowance mailed Jan. 17, 2014 for U.S. Appl. No. 13/725,331, 8 pages.
Notice of Allowance mailed Mar. 17, 2014 for U.S. Appl. No. 13/592,224, 8 pages.
Notice of Allowance mailed Sep. 17, 2013 for U.S. Appl. No. 13/679,976, 8 pages.
Notice of Allowance mailed Sep. 17, 2014 for U.S. Appl. No. 13/960,735, 9 pages.
Notice of Allowance mailed Sep. 17, 2014 for U.S. Appl. No. 13/462,653, 7 pages.
Notice of Allowance mailed Sep. 18, 2012 for U.S. Appl. No. 12/900,232, 8 pages.
Notice of Allowance mailed Sep. 18, 2014 for U.S. Appl. No. 13/920,021, 8 pages.
Notice of Allowance mailed Sep. 18, 2014 for U.S. Appl. No. 13/586,815, 9 pages.
Notice of Allowance mailed Jun. 19, 2012 for U.S. Appl. No. 12/861,650, 7 pages.
Notice of Allowance mailed Sep. 19, 2013 for U.S. Appl. No. 13/585,759, 8 pages.
Notice of Allowance mailed Feb. 20, 2014 for U.S. Appl. No. 13/468,201, 10 pages.
Notice of Allowance mailed Mar. 20, 2014 for U.S. Appl. No. 13/598,550, 8 pages.
Notice of Allowance mailed Oct. 21, 2011 for U.S. Appl. No. 12/582,086, 8 pages.
Notice of Allowance mailed Oct. 21, 2014 for U.S. Appl. No. 13/426,869, 11 pages.
Notice of Allowance mailed May 22, 2012 for U.S. Appl. No. 12/815,369, 10 pages.
Notice of Allowance mailed Oct. 23, 2013 for U.S. Appl. No. 13/417,135, 11 pages.

(56) References Cited

OTHER PUBLICATIONS

Notice of Allowance mailed Jan. 24, 2013 for U.S. Appl. No. 13/314,513, 5 pages.
Notice of Allowance mailed Jul. 24, 2012 for U.S. Appl. No. 12/939,824, 5 pages.
Notice of Allowance mailed Oct. 25, 2012 for U.S. Appl. No. 12/894,087, 8 pages.
Notice of Allowance mailed Sep. 25, 2014 for U.S. Appl. No. 13/447,036, 11 pages.
Notice of Allowance mailed Sep. 26, 2014 for U.S. Appl. No. 13/594,665, 9 pages.
Notice of Allowance mailed Aug. 27, 2014 for U.S. Appl. No. 13/077,941, 9 pages.
Notice of Allowance mailed Nov. 18, 2012 for U.S. Appl. No. 13/290,024, 9 pages.
Notice of Allowance mailed Oct. 28, 2013 for U.S. Appl. No. 13/194,500, 13 pages.
Notice of Allowance mailed Oct. 28, 2013 for U.S. Appl. No. 13/651,169, 10 pages.
Notice of Allowance mailed Nov. 29, 2012 for U.S. Appl. No. 12/815,318, 8 pages.
Notice of Allowance mailed Oct. 29, 2012 for U.S. Appl. No. 13/149,807, 8 pages.
Notice of Allowance mailed May 30, 2012 for U.S. Appl. No. 12/833,898, 5 pages.
Notice of Allowance mailed Sep. 30, 2013 for U.S. Appl. No. 13/481,696, 9 pages.
Notice of Allowance mailed Aug. 31, 2012 for U.S. Appl. No. 13/051,296, 8 pages.
Notice of Allowance mailed Oct. 8, 2014 for U.S. Appl. No. 13/077,941, 4 pages.
Office Action mailed Apr. 1, 2013 for U.S. Appl. No. 13/174,077, 15 pages.
Office Action mailed Aug. 1, 2012 for U.S. Appl. No. 12/894,098, 31 pages.
Office Action mailed Mar. 1, 2012 for U.S. Appl. No. 12/835,704, 18 pages.
Office Action mailed Aug. 2, 2013 for U.S. Appl. No. 13/594,665, 35 pages.
Office Action mailed Sep. 2, 2014 for U.S. Appl. No. 13/705,082, 41 pages.
Office Action mailed Apr. 3, 2014 for U.S. Appl. No. 13/870,919, 56 pages.
Office Action mailed Oct. 3, 2013 for U.S. Appl. No. 13/921,157, 21 pages.
Office Action mailed Apr. 5, 2012 for U.S. Appl. No. 12/833,898, 17 pages.
Office Action mailed Oct. 5, 2011 for U.S. Appl. No. 11/875,541, 16 pages.
Office Action mailed Apr. 6, 2015 for U.S. Appl. No. 14/034,390, 27 pages.
Office Action mailed Dec. 6, 2013 for U.S. Appl. No. 13/564,639, 28 pages.
Office Action mailed Dec. 6, 2013 for U.S. Appl. No. 13/960,735, 19 pages.
Office Action mailed Feb. 6, 2014 for U.S. Appl. No. 13/434,567, 34 pages.
Office Action mailed Mar. 6, 2013 for U.S. Appl. No. 13/174,264, 30 pages.
Office Action mailed Mar. 6, 2013 for U.S. Appl. No. 13/679,976, 27 pages.
Office Action mailed Sep. 6, 2011 for U.S. Appl. No. 12/582,086, 19 pages.
Office Action mailed Dec. 7, 2012 for U.S. Appl. No. 13/436,714, 30 pages.
Office Action mailed Mar. 7, 2013 for U.S. Appl. No. 13/651,169, 15 pages.
Office Action mailed May 7, 2013 for U.S. Appl. No. 13/585,759, 22 pages.

European Office Action dated Aug. 8, 2012 for European Application No. EP11005207, 4 pages.
Office Action mailed Jan. 8, 2014 for U.S. Appl. No. 12/861,432, 23 pages.
Office Action mailed Jun. 8, 2012 for U.S. Appl. No. 11/875,541, 18 pages.
Office Action mailed Aug. 9, 2013 for U.S. Appl. No. 13/764,710, 15 pages.
Office Action mailed Jul. 9, 2013 for U.S. Appl. No. 13/447,036, 26 pages.
Office Action mailed Jul. 9, 2014 for U.S. Appl. No. 14/166,691, 18 pages.
Advisory Action mailed Jun. 8, 2012 for U.S. Appl. No. 12/835,704, filed Jul. 13, 2012.
Avila A., et al., "Switching in Coplanar Amorphous Hydrogenated Silicon Devices," Solid-State Electronics, 2000, vol. 44 (1), pp. 17-27.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., et al., "Aluminum Spiking at Contact Windows in Al/Ti—W/Si," Applied Physics Letters, 1988, vol. 52 (4), pp. 272-274.
Chen Y., et al., "Nanoscale Molecular-switch Crossbar Circuits," Nanotechnology, 2003, vol. 14, pp. 462-468.
Choi J.W., "Bistable [2]Rotaxane Based Molecular Electronics: Fundamentals and Applications", Dissertation, Chapter 3, California Institute of Technology, Pasadena, 2007, pp. 79-120. Retrieved from the Internet:.
Chou S.Y., et al., "Imprint Lithography With 25-Nanometer Resolution," Science, 1996, vol. 272, pp. 85-87.
Collier C.P., et al., "Electronically Configurable Molecular-based Logic Gates ," Science, 1999, vol. 285 (5426), pp. 391-394.
Corrected Notice of Allowability mailed Oct. 1, 2013 for U.S. Appl. No. 13/733,828, 5 pages.
Corrected Notice of Allowability mailed Jan. 11, 2013 for U.S. Appl. No. 12/861,666, 8 pages.
Dehon A., "Array-Based Architecture for FET-Based, Nanoscale Electronics," IEEE Transactions on Nanotechnology, 2003, vol. 2 (1), pp. 23-32.
Del Alamo J., et al., "Operating limits of Al-alloyed High-low Junction for BSF Solar Cells," Solid-State Electronics, 1981, vol. 24, pp. 415-420.
Den Boer W., "Threshold Switching in Hydrogenated Amorphous Silicon," Applied Physics Letters, 1982, vol. 40, pp. 312-813.
Dey, "Electrothermal Model of Switching in Amorphous Silicon Films," Journal of Vacuum Science & Technology , 1980, vol. 17 (1), pp. 445-448.
Dong Y., et al., "Si/a-Si Core/Shell Nanowires as Nonvolatile Crossbar Switches," Nano Letters, 2008, vol. 8 (2), pp. 386-391.
European Search Report for Application No. EP09819890.6 mailed on Mar. 27, 2012.
European Search Report for Application No. EP11005207.3 mailed on Oct. 12, 2011.
European Search Report for Application No. EP14000949, mailed on Jun. 4, 2014, 7 pages.
Ex parte Quayle Action mailed May 8, 2012 for U.S. Appl. No. 12/826,653, filed Jun. 29, 2010.
Gangopadhyay S., et al., "Memory Switching in Sputtered Hydrogenated Amorphous Silicon (a-Si:H)," Japanese Journal of Applied Physics, 1985, vol. 24 (10), pp. 1363-1364.
Goronkin H., et al., High-Performance Emerging Solid-State Memory Technologies, MRS Bulletin, Nov. 2004, pp. 805-813. Retrieved from the Internet:.
Jo S.H., et al., "CMOS Compatible Nanoscale Nonvolatile Resistance Switching Memory," Nano Letters, 2008, vol. 8 (2), pp. 392-397.
Hajto J., et al., "Analogue Memory and Ballistic Electron Effects in Metal-amorphous Silicon Structures," Philosophical Magazine, 1991, vol. 63 (1), pp. 349-369.

(56) References Cited

OTHER PUBLICATIONS

Hajto J., et al., "Electronic Switching in Amorphous-Semiconductor Thin Films", Chapter 14, 1992, pp. 640-701.
Hajto J., et al., "The Programmability of Amorphous Silicon Analogue Memory Elements," Materials Research Society Symposium Proceedings , 1990, vol. 192, pp. 405-410.
Holmes A.J., et al., "Design of Analogue Synapse Circuits using Non-Volatile a-Si:H Memory Devices", Proceedings of ISCAS, 1994, pp. 351-354.
Hu J., et al., "AC Characteristics of Cr/p.sup.+a-Si:H/V Analog Switching Devices," IEEE Transactions on Electron Devices, 2000, vol. 47 (9), pp. 1751-1757.
Hu X.Y., et al., "Write Amplification Analysis in Flash-based Solid State Drives", SYSTOR'09; 20090504-20090406, May 4, 2009, pp. 1-9.
Hudgens S., et al., "Overview of Phase-Change Chalcogenide Nonvolatile Memory Technology", MRS Bulletin, Nov. 2004, pp. 829-832. Retrieved from the Internet:.
International Search Report and Written Opinion for Application No. PCT/US2011/040362, mailed on Jan. 19, 2012, 7 pages.
International Search Report and Written Opinion for Application No. PCT/US2011/046035, mailed on Mar. 27, 2012, 6 pages.
International Search Report and Written Opinion for Application No. PCT/US2012/040232, mailed on Feb. 26, 2013, 7 pages.
International Search Report and Written Opinion for Application No. PCT/US2012/040242, mailed on Jan. 31, 2013, 9 pages.
International Search Report and Written Opinion for Application No. PCT/US2012/044077, mailed on Jan. 25, 2013, 9 pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report and Written Opinion for Application No. PCT/US2013/061244, mailed on Jan. 28, 2014, 8 pages.
International Search Report and Written Opinion for Application No. PCT/US2013/077628, mailed on Apr. 29, 2014, 12 pages.
International Search Report for Application No. PCT/US2009/060023, mailed on May 18, 2010, 3 pages.
International Search Report for Application No. PCT/US2009/061249, mailed on May 19, 2010, 3 pages.
International Search Report for Application No. PCT/US2011/040090, mailed on Feb. 17, 2012, 5 pages.
International Search Report for Application No. PCT/US2011/045124, mailed on May 29, 2012, 3 pages.
International Search Report for Application No. PCT/US2011/046036, mailed on Feb. 23, 2012, 3 pages.
Jafar M., et al., "Switching in Amorphous-silicon Devices," Physical Review, 1994, vol. 49 (19), pp. 611-615.
Jian Hu., et al., "Area-Dependent Switching In Thin Film-Silicon Devices," Materials Research Society Symposium Proceedings, 2003, vol. 762, pp. A 18.3.1-A 18.3.6.
Jian Hu., et al., "Switching and Filament Formation in hot-wire CVD p-type a-Si:H devices," Thin Solid Films, Science Direct, 2003, vol. 430, pp. 249-252.
Jo S.H., et al., "A Silicon-Based Crossbar Ultra-High-Density Non-Volatile Memory", SSEL Annual Report, 2007.
Jo S.H., et al., "Ag/a-Si:H/c-Si Resistive Switching Nonvolatile Memory Devices," Nanotechnology Materials and Devices Conference, 2006, vol. 1, pp. 116-117.
Office Action mailed Sep. 30, 2013 for U.S. Appl. No. 13/189,401 , 42 pages.
Office Action mailed Sep. 30, 2013 for U.S. Appl. No. 13/462,653, 35 pages.
Owen A.E., et al., "Electronic Switching in Amorphous Silicon Devices: Properties of the Conducting Filament", Proceedings of 5th International Conference on Solid-State and Integrated Circuit Technology, IEEE, 1998, pp. 830-833.
Owen A.E., et al., "Memory Switching in Amorphous Silicon Devices," Journal of Non-Crystalline Solids, 1983, vol. 50-60 (Pt.2), pp. 1273-1280.
Owen A.E., et al., "New Amorphous-Silicon Electrically Programmable Nonvolatile Switching Device," Solid-State and Electron Devices, IEEE Proceedings, 1982, vol. 129 (Pt. 1), pp. 51-54.
Owen A.E., et al., "Switching in Amorphous Devices," International Journal of Electronics, 1992, vol. 73 (5), pp. 897-906.
Rose M.J., et al., "Amorphous Silicon Analogue Memory Devices," Journal of Non-Crystalline Solids, 1989, vol. 115, pp. 168-170.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Scott J.C., "Is There an Immortal Memory?," American Association for the Advancement of Science, 2004, vol. 304 (5667), pp. 62-63.
Shin W., et al., "Effect of Native Oxide on Polycrystalline Silicon CMP," Journal of the Korean Physical Society, 2009, vol. 54 (3), pp. 1077-1081.
Stikeman A., Polymer Memory—The Plastic Path to Better Data Storage, Technology Review, Sep. 2002, pp. 31. Retrieved from the Internet:.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Sune J., et al., "Nondestructive Multiple Breakdown Events in Very Thin Si02 Films," Applied Physics Letters, 1989, vol. 55, pp. 128-130.
Terabe K., et al., "Quantized Conductance Atomic Switch," Nature, 2005, vol. 433, pp. 47-50.
Waser R., et al., "Nanoionics-based Resistive Switching Memories," Nature Materials, 2007, vol. 6, pp. 833-835.
Written Opinion for PCT Application No. PCT/US2009/060023, mailed on May 18, 2010, 3 pages.
Written Opinion for PCT Application No. PCT/US2009/061249, mailed on May 19, 2010, 3 pages.
Written Opinion for PCT Application No. PCT/US2011/040090, mailed on Feb. 17, 2012, 6 pages.
Written Opinion for PCT Application No. PCT/US2011/045124, mailed on May 29, 2012, 5 pages.
Written Opinion for PCT Application No. PCT/US2011/046036, mailed on Feb. 23, 2012, 4 pages.
Yin S., "Solution Processed Silver Sulfide Thin Films for Filament Memory Applications", Technical Report No. UCB/EECS-2010-166, Dec. 17, 2010, Electrical Engineering and Computer Sciences, University of California at Berkeley. Retrieved from the Internet:.
Yuan H.C., et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Yankovych S., et al., "Nanoimprint Lithography: Challenges and Prospects," Nanotechnology, 2001, vol. 12, pp. 91-95.
Notice of Allowance for U.S. Appl. No. 14/611,022 dated Feb. 12, 2016, 13 pages.
Notice of Allowance for U.S. Appl. No. 14/611,022 dated Sep. 10, 2015, 13 pages.
Office Action for U.S. Appl. No. 14/611,022 dated May 7, 2015, 13 pages.
Office Action for European Application No. EP11005207.3 dated Aug. 8, 2012, 4 pages.
European Search Report for European Application No. EP11005649 mailed Oct. 15, 2014, 2 pages.
Japanese Office Action (English Translation) for Japanese Application No. 2011-153349 mailed Feb. 24, 2015, 3 pages.
Japanese Search Report (English Translation) for Japanese Application No. 2011-153349 dated Feb. 9, 2015, 11 pages.
Japanese Office Action (English Translation) for Japanese Application No. 2013-525926 mailed Mar. 3, 2015, 4 pages.
Japanese Search Report (English Translation) for Japanese Application No. 2013-525926 dated Feb. 9, 2015, 15 pages.

(56) References Cited

OTHER PUBLICATIONS

Japanese Office Action (English Translation) for Japanese Application No. 2014-513700 mailed Jan. 12, 2016, 4 pages.
Japanese Search Report (English Translation) for Japanese Application No. 2014-513700 dated Jan. 14, 2016, 25 pages.
Chinese Office Action (English Translation) for Chinese Application No. 201110195933.7 dated Jul. 31, 2014, 4 pages.
Chinese Office Action (English Translation) for Chinese Application No. 201110195933.7 dated May 18, 2015, 4 pages.
Chinese Office Action (English Translation) for Chinese Application No. 201180050941.0 dated Apr. 3, 2015, 8 pages.
Chinese Office Action (English Translation) for Chinese Application No. 201180050941.0 dated Dec. 9, 2015, 5 pages.
Chinese Search Report (English Translation) for Chinese Application No. 201180050941.0 dated Mar. 25, 2015, 1 page.
Chinese Office Action (with English Translation) for Chinese Application No. 201290000773.4 dated Jun. 9, 2014, 3 pages.
Chinese Office Action (English Translation) for Chinese Application No. 201280027066.9 dated Nov. 23, 2015, 5 pages.
Chinese Search Report (English Translation) for Chinese Application No. 201280027066.9 dated Nov. 13, 2015, 2 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Office Action for U.S. Appl. No. 14/887050 dated Mar. 11, 2016, 12 pages.
Office Action for U.S. Appl. No. 15/046,172 dated Apr. 20, 2016, 8 pages.
Office Action mailed Dec. 3, 2015 for U.S. Appl. No. 14/253,796.
Office Action mailed Apr. 15, 2016 for U.S. Appl. No. 14/597,151.
Office Action mailed Mar. 17, 2015 for U.S. Appl. No. 14/573,770.
Office Action mailed Oct. 25, 2012 for U.S. Appl. No. 13/461,725, filed May 1, 2012.
Office Action mailed Apr. 8, 2016 for U.S. Appl. No. 14/573,770.
Office Action mailed May 20, 2016 for U.S. Appl. No. 14/613,299.
Office Action mailed Jul. 9, 2015 for U.S. Appl. No. 14/573,817.
Office Action dated Aug. 12, 2016 for U.S. Appl. No. 14/667,346, 27 pages.
Office Action dated Aug. 12, 2016 for U.S. Appl. No. 14/613,301, 43 pages.
Office Action dated Aug. 23, 2016 for U.S. Appl. No. 14/613,585, 9 pages.
Notice of Allowance dated Sep. 14, 2016 for U.S. Appl. No. 14/588,202, 119 pages.
Chinese Office Action (with English Translation) for Chinese Application No. 201280027066.9 mailed on Jul. 4, 2016, 5 pages.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
European Office Action for Application No. 11005649.6 dated Dec. 1, 2014, 2 pages.
European Office Action for Application No. 11005649.6 dated Nov. 17, 2015, 5 pages.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096, filed Jun. 15, 2012.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pgs.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 14/611,022 dated Jun. 8, 2016, 57 pages.
Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Jan. 16, 2014 for U.S. Appl. No. 13/921,157, filed Jun. 18, 2013.
Notice of Allowance mailed May 17, 2013 for U.S. Appl. No. 13/290,024.
Notice of Allowance mailed Apr. 2, 2013 for U.S. Appl. No. 13/149,757, filed May 31, 2011.
Notice of Allowance mailed Feb. 10, 2015 for U.S. Appl. No. 13/525,096, filed Jun. 15, 2012.
Notice of Allowance mailed Mar. 20, 2014 for U.S. Appl. No. 13/461,725, filed May 1, 2012.
Notice of Allowance mailed Dec. 23, 2015 for U.S. Appl. No. 14/573,770.
Notice of Allowance mailed Apr. 20, 2016 for U.S. Appl. No. 14/573,817.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.

(56) References Cited

OTHER PUBLICATIONS

Office Action for U.S. Appl. No. 14/207,430 dated Jul. 25, 2016, 79 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Notice of Allowance for U.S. Appl. No. 14/612,025 dated Oct. 19, 2016, 108 pages.
Notice of Allowance for U.S. Appl. No. 14/509,967 dated Oct. 24, 2016, 42 pages.
Notice of Allowance for U.S. Appl. No. 13/952,467 dated Sep. 28, 2016, 128 pages.
Notice of Allowance for U.S. Appl. No. 14/611,022 dated Oct. 26, 2016, 41 pages.
Notice of Allowance dated Oct. 5, 2016 for U.S. Appl. No. 14/887,050, 113 pages.
Notice of Allowance for U.S. Appl. No. 14/383,079 dated Aug. 17, 2016, 71 pages.
Office Action for U.S. Appl. No. 14/597,151 dated Oct. 20, 2016, 52 pages.
Notice of Allowance for U.S. Appl. No. 15/046,172 dated Oct. 4, 2016, 116 pages.
Office Action for U.S. Appl. No. 14/588,136 dated Nov. 2, 2016, 132 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.

* cited by examiner

200 ⟶

300 ⟶

METHODS FOR FABRICATING RESISTIVE MEMORY DEVICE SWITCHING MATERIAL USING ION IMPLANTATION

REFERENCE TO RELATED APPLICATIONS

The present application is a non-provisional of and claims the benefit of U.S. Provisional Patent Application Ser. No. 61/789,888 entitled "METHOD TO CREATE/MODIFY THE SWITCHING MATERIAL OF A SILVER BASED RERAM DEVICE BY MEANS OF ION IMPLANTATION" and filed Mar. 15, 2013; and is a continuation-in-part of and claims priority to U.S. patent application Ser. No. 14/034,390, filed Sep. 23, 2013 which is a continuation of U.S. patent application Ser. No. 13/585,759, filed Aug. 14, 2012, now U.S. Pat. No. 8,569,172, issued Oct. 29, 2013. These applications are incorporated herein by reference in their entirety and for all purposes.

TECHNICAL FIELD

The subject disclosure relates generally to non-volatile memory, and as one illustrative example, a non-volatile, resistive memory device.

BACKGROUND

The inventors of the present disclosure have proposed models of two-terminal memory devices that are believed by the inventors to be able to operate as viable alternatives to various memory cell technologies, such as metal-oxide semiconductor (MOS) type memory cells employed for electronic storage of digital information. Models of two-terminal memory such as resistive-switching memory devices among others, are believed by the inventors to provide some potential advantages over non-volatile FLASH MOS type transistors, including smaller die size, higher memory density, faster switching (e.g., from a relatively conductive state to a relatively non-conductive state, or vice versa), good data reliability, low manufacturing cost, and other advantages, for example.

One anticipated memory model proposed by the inventor(s) is resistive switching memory. The inventors believe resistive switching memory can hold substantial advantages over competing technologies in the semiconductor electronics industry, including, e.g., high density non-volatile storage. A resistive switching device, according to some models proposed by the inventors, has an insulator layer that is provided between a pair of electrodes and exhibits electrical pulse induced hysteretic resistance switching effects. The inventors have suggested that a filament(s) can be formed between the electrodes by a diffusion and or drift of ions that reduce or increase the resistance of the structure and remain after being induced, giving the device a non-volatile characteristic in a programmed state. The inventors are currently involved in research and development to explore additional characteristics and advantages of two-terminal memory in general.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments disclosed herein provide a two-terminal memory device that can comprise a first metal electrode above a first oxide layer over a semiconductor substrate. The two-terminal memory device can comprise a pillar structure that comprises contact material layer on a top surface of the first metal electrode, wherein the contact material layer is conductive. The pillar structure can also comprise a switching layer on top of the contact material, wherein the switching layer comprises contact material that is ionized. The two-terminal memory device can also include second metal electrode above and in contact with a top surface of the pillar structure, wherein the second metal electrode includes an active metal layer in contact with the top surface of the switching layer of the pillar; and a conductor layer in contact with the active material.

Various embodiments provide for a method for forming or fabricating a two-terminal memory device. The method can comprise forming a bottom metal wiring layer above an oxide layer over a semiconductor substrate and forming bottom metal electrodes from the bottom metal wiring layer. The method can comprise forming an oxide layer between the bottom metal electrodes and disposing a conductive layer in contact with a top surface of the bottom metal electrodes. The method can comprise forming a plurality of pillars from the conductive layer and forming an oxide layer between the plurality of pillars, exposing a top surface of the plurality of pillars. The method can comprise implanting ions into the top surface of the plurality of pillars from the top surface of the pillars thereby amorphizing a top portion of the plurality of pillars, forming a top metal wiring layer above the top portion of the plurality of pillars and forming top metal electrodes from the top metal wiring layer. In various embodiments, the top metal wiring layer may include an active metal material, such as copper, silver, gold, aluminum, or the like, a barrier material such as tungsten, TiN or the like, and a top metal conductor layer on top of the barrier material, e.g. Al, Cu, or the like.

Various embodiments also provide for an electronic device comprising an electronic memory unit that can comprise one or more arrays of multi-state memory cells configured to store information. The multi-state memory cells can comprise a first metal electrode above a first oxide layer over a semiconductor substrate. The multi-state memory cells can comprise a pillar structure that comprises contact material layer on a top surface of the first metal electrode, wherein the contact material layer is conductive. The pillar structure can also comprise a switching layer on top of the contact material, wherein the switching layer comprises contact material that is ionized. The multi-state memory cells can also include second metal electrode above and in contact with a top surface of the pillar structure, wherein the second metal electrode includes an active metal layer in contact with the top surface of the switching layer of the pillar; and a conductor layer in contact with the active material.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
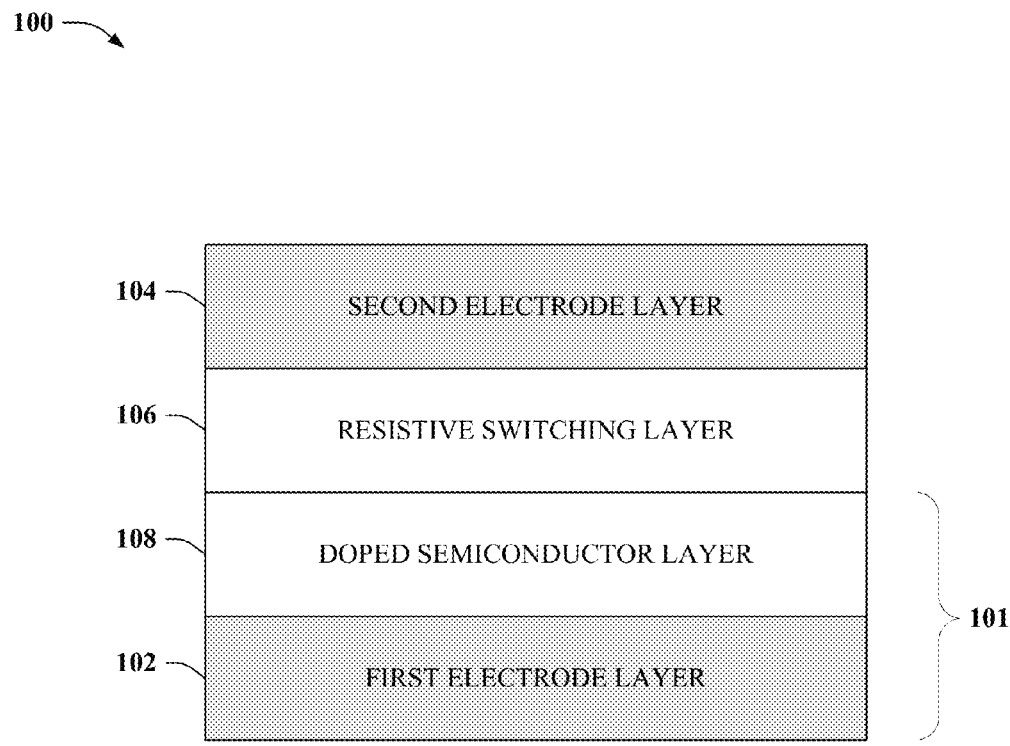
FIG. 1 illustrates a schematic diagram of an example memory cell with an ion implanted resistive switching layer in accordance with various aspects described herein.

This disclosure relates to two-terminal memory cells employed for digital information storage. In some embodiments, the two-terminal memory cells can include a resistive technology, such as a resistive-switching two-terminal memory cells. Resistive-switching two-terminal memory cells (also referred to as resistive-switching memory cells or resistive-switching memory), as utilized herein, comprise circuit components having two conductive contacts (also referred to herein as electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (resistive memory).

Various types of resistive switching memory cells are envisioned as having various types of switching mediums, such as layered amorphous silicon (a-Si), metal oxides and non-stoichiometric silicon oxides (e.g. SiOx), as well as other materials. Resistive-switching devices can have, for example, a four-layer arrangement of first metal/switching layer/conductive silicon/second metal, which can include: second metal (e.g. Cu, Al)/doped polycrystalline silicon (e.g. doped polysilicon, doped polycrystalline silicon germanium)/resistive (amorphous silicon, intrinsic semiconductor, SiOx) switching layer/first metal (e.g. Ag, Au, Pt, Al, etc.). The resistive switching layer essentially serves as an information storage medium, and can also be referred to as a resistive switching layer (RSL), resistive switching medium (RSM), a switching medium, an inducting switching medium, or the like. The switching layer, as referred to herein, can include other materials as well, such as oxides, solid electrolyte materials, etc., and the first metal and the second metal may include additional barrier layers, adhesion layers, and the like.

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer for providing filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventor(s) of the present application are of the opinion that two-terminal memory devices, such as resistive switching memory devices, have various advantages in the field of electronic memory. For instance, resistive-switching memory technology can generally be small, typically consuming silicon area on the order of $4F^2$ per adjacent resistive-switching device where F stands for the minimum feature size of a technology node (e.g., a memory cell comprising two resistive-switching devices would therefore be approximately $8F^2$ if constructed in adjacent silicon space if on the order of $4F^2$). Non-adjacent resistive-switching devices, e.g., stacked above or below each other, can consume as little as $4F^2$ for a set of multiple non-adjacent devices. Moreover, multi-bit devices having two, three or more bits (e.g., resistance states) per memory cell can result in even greater densities in terms of bits per silicon area consumed. These advantages can lead to greater semiconductor component density and memory density, and low manufacturing costs for a given number of digital storage bits. The inventor(s) also believes that resistive-switching memory can exhibit fast programming speed and low programming current, and smaller cell sizes enabling greater component densities. Other benefits anticipated by the inventor(s) include non-volatility, having the capacity to store data without continuous application of power, and capacity to be built between metal interconnect layers, enabling resistive switching based devices to be usable for two-dimension as well as three-dimension semiconductor architectures.

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

Overview

In various embodiments of the subject disclosure, a conductive polycrystalline layer (e.g. pillar structure, planar structure, and so forth, and comprised of, e.g. doped polysilicon, doped SiGe, etc.) can be implanted with material (e.g., ions, atoms that can be ionized in response to a field, or the like) that degrade and modify an upper region of the conductive polycrystalline layer. The upper region becomes a relatively insulating layer, and includes resistive switching properties. In an embodiment, the switching properties can be adjusted so that the voltage applied to the electrodes in order to induce a change in resistive state can be modified. The projected range or depth of the ion implantation can also be controlled, allowing for preferential placement of atoms in the switching material and thus fine-tuning the required forming voltage. The dose and number of atoms implanted is also controllable, allowing for significant control over concentration. The type of atoms or ions that are implanted can be based on the type of the conductive polycrystalline material used, wherein the atoms are selected in order to amorphize the polycrystalline structure.

Non-Limiting Examples of Creating or Modifying the Switching Material of a Resistive Memory Device Using Ion Implantation Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring now to the drawings, FIG. 1 apparatus 100 is depicted. A memory cell 100 can include a pair of electrodes with at least one electrode as a current-limiting electrode (e.g., a bottom electrode). The cell 100 can comprise a bottom electrode 101 that comprises a monotonically increasing doping concentration profile, a localized homogeneity, and uniform crystallinity. In some embodiments, an annealing process of the device 100 at the bottom electrode 101 enables the bottom electrode 101 to comprise a controlled sheet resistance, and thus, achieve an on-state current modulability (e.g., a conductive filament on-state modulation or variance) for a uniform switching behavior within a resistive switching layer.

The memory cell device 100 can operate as a resistive memory cell device, such as a multi-state memory cell device. For example, the memory cell device 100 can initially be in an Off-state (erase state) and highly resistive to current between electrodes. In addition, the cell 100 can be programmed in an On-state (program state) to form a conductive path that decreases resistivity to a desired or a programmed degree. The programming of the cell can be a result of an electrical signal such as a polar electrical signal or an electric field. For example, a positive voltage introduced at one of the electrodes can induce an electric field that forms metal ions in the switching medium and attracts the metal ions towards the negative electrode. The cell 100 can be programmed by a sufficiently large electrical signal such that the metal ions form a conductive path (i.e. filament) through the resistive switching layer 106. Further, the cell 100 can be erased by application of an opposite polarity off-state voltage (bipolar cell) or by application of a voltage larger than the program voltage (unipolar cell) by rupturing the filament formed within the resistive switching layer 106. In such conditions, the erase voltage pulls the ions towards the second electrode layer 104, for example.

The memory cell 100 can include a plurality of electrodes that can comprise a first electrode layer 102 and a second electrode layer 104, which can represent a pair of electrodes from top (bottom) to bottom (top), respectively, or metal electrodes arranged in different configurations than the present example, such as from left to right or right to left (not shown). Between these two electrodes, a resistive switching material layer 106, or a switching layer having an insulator switching medium, can reside adjacent to the second electrode layer 104 and the bottom electrode 101, for example.

The second electrode layer 104 can comprise a conductive metal (e.g., an elemental metal, an ionically bonded metal, etc.), which can be ionized (e.g., oxidized), or can produce ions at a boundary of first electrode layer 104 and resistive switching layer 106. The ionization or production of ions can be in response to a suitable electric field, application of a suitable heat (e.g., temperature), or other suitable process. The conductive ions can be capable of leaving a boundary of the second electrode layer 104 in response to a suitable stimulus (e.g., an electric field of a suitable direction and magnitude, a suitable temperature gradient, and so forth). These conductive ions, upon leaving the second electrode layer 104 and entering another entity (e.g., the resistive switching material layer 106) can tend to alter electrical characteristics of the other entity. In some embodiments, these conductive ions can serve to increase conductivity of the other entity, at least within a vicinity of the displaced ions. When the electrical signal is withdrawn, the metal ions become non-ionic metal atoms (e.g., having no net charge). In further embodiments, metal atoms can serve to decrease conductivity of the other entity, for instance by amorphizing a crystalline structure of the other entity (e.g., amorphizing some or all of a doped polysilicon conductor, among others). As one example of the latter embodiments, resistive switching layer 106 can be formed at least in part by injecting material suitable to amorphize a subset of doped semiconductor layer 108, forming an amorphous resistive switching layer 106 distinct from, and having significantly lower conductivity than, doped semiconductor layer 108.

Suitable materials for second electrode layer 104 can vary. One example is silver, also referred to herein in its periodic table form Ag as part of an active metal portion (not shown) of the second electrode layer 104. Another example can include copper (e.g., Cu), and still other examples can include compounds of silver, copper, aluminum, or the like, or a suitable combination thereof. In one or more embodiments, second electrode layer 104 can comprise one or more additional layers (e.g., some quite thin, such as 2 to 3 nanometers (nm)), such as Ti, TiN, W, or the like, adjacent to second electrode layer 104 as a barrier layer (e.g., to mitigate oxidation), an ion migration inhibitor layer, or the like. In various embodiments, second electrode layer 104 may include a metal wiring layer (e.g. Al, Cu) that is coupled to other components, e.g. memory row drivers, memory column drivers, CMOS logic, and the like.

The memory cell 100 can be placed in an On-state (a program state) by applying an electrical signal, such as a program voltage Vp to the first electrode layer 102 that is larger than a threshold (e.g., 2~6V, or other like threshold). The switching material can include amorphous silicon, amorphous silicon germanium, silicon dioxide ($SiO_2$) or a suitable derivative of silicon dioxide, silicon-on-glass (SOG), a solid electrolyte, or another suitable chalcogenide or oxide, including silicon sub-oxide, $SiO_x$, where x is less than or equal to 2. In some embodiments, the switching material can be formed from an upper region of a p+ polycrystalline silicon or p+ silicon germanium bearing layer using an Argon, Silicon, Oxygen plasma etch, or the like. For instance, a plasma etch may use a bias power within a range of approximately 30 watts to approximately 120 watts to convert an upper region of the polysilicon or silicon germanium material into a non-conductive amorphous silicon having p-type impurities or a native silicon oxide (from a polycrystalline silicon or a silicon germanium bearing layer).

A conductive path (not shown) can be formed within the resistive switching material/medium layer 106 in response to a suitable electric signal (e.g., an electric field or voltage, a current, and so forth) applied to the device. The electric signal applied across the switching medium 106 can induce formation of metal ions and a diffusion or drift of ions (e.g., metal ions) from the second electrode layer 104 toward the first electrode layer 102, or vice versa, from the first electrode layer 101 toward the second electrode layer 104, based on a specific configuration of the illustrated materials, location of an electro deposition, or other process parameters.

In one embodiment, the bottom electrode 101 can comprise a first and a second semiconductor layer within the semiconductor layer 108, in which a top layer comprises a doped polysilicon from a one-step deposition process of an un-doped amorphous silicon and a subsequent annealing within an ambient gas, an implantation step, as described herein, or the like. The doped polysilicon (or doped polycrystalline silicon germanium) comprises dopants from a bottom layer of doped silicon material such as a p+ silicon substrate, which is heavily doped and uniformly moves dopants (e.g., Boron or the like) into the amorphous un-doped silicon layer above. Thus, in some embodiments, the semiconductor layer 108 comprises a doping concentration that monotonically increasing profile or a relatively constant increasing profile throughout at least a portion of the material, such as from the bottom layer to the top layer, as further illustrated and discussed below.

In another aspect, the bottom electrode 101 can operate to achieve a current-limiting bottom electrode (e.g. doped semiconductor layer 108). The bottom electrode 101 can be fabricated to comprise one or more of a wide range of resistances by varying the annealing time and temperature of the annealing parameters in the fabrication processes. For example, the bottom electrode 101 can comprise a converted polysilicon or poly-Si layer within a semiconductor layer 108, which resides upon or in contact with the first electrode layer 102. The semiconductor layer 108 comprising converted polysilicon can operate to control an on-state current, which depends upon the conductivity of the bottom electrode 101.

In an aspect, depending upon the annealing process parameters (e.g., an annealing time or an annealing temperature), a different resistivity and a different sheet resistance can be obtained for controlling on-state current of the resistive memory cell device. For example, a one thousand times difference or range can be fabricated and comprised by the semiconductor layer 108 based on the various annealing parameters for annealing a single layer of un-doped amorphous silicon in the bottom electrode 101. Additionally, the thickness of the bottom electrode over the device, an array or a wafer, for example, can be controlled via the annealing process, which provides various benefits (e.g., control and flexibility). In some embodiments, manufacture of the bottom electrode 101 also does not have a separate doping step, an additional deposition step in the fabrication of the device. Rather, the amorphous silicon of the semiconductor layer 108 is doped by a bottom heavily doped polysilicon layer, which enables an exact thickness of the bottom electrode to be controlled, instead of more uncontrollable fabrication processes such as an etch or an etch of an additional layer, for example. In some embodiments, where a doped SiGe material is used, no separate anneal process is required to form doped semiconductor layer 108.

The switching medium layer 106 can be comprised of various materials and various layers of material, as discussed in detail below. For example, the switching medium layer 106 can be any suitable material or switching medium having high electrical resistance and having at least partial permeability (e.g., in response to an electric signal) to ions of the second electrode layer 104 or ions that are generated within the switching medium (e.g., metal or oxygen ions). In addition, the material employed for electrically resistive switching medium layer 106 can be compatible with semiconductor fabrication processes (e.g., stacking, etching, masking, deposition, etc.). Examples of such a material can include an amorphous silicon (a-Si) material, a chalcogenide, a silicon on glass, an oxide such as titanium oxide (TiOx), tantalum oxide (TaOx), silicon dioxide (e.g., $SiO_2$), silicon sub-oxide (e.g. $SiO_x$), Hafnium Oxide ($HfO_x$), Nickel Oxide ($NiO_x$), Tungsten Oxide ($WO_x$), Aluminum Oxide ($AlO_x$), Copper Oxide ($CuO_x$), Germanium Oxide ($GeO_x$), Silicon Germanium Oxide ($Si_xGe_yO_z$), Silicon Oxi-Nitride ($SiO_xN_y$), Silver Germanium Selenide ($Ag_xGe_ySe_z$), Silver Selenide ($Ag_2Se$), Copper Sulfite ($Cu_2S$), other oxide, or a suitable combination thereof, which is at least in part porous with respect to the particles, ions or the like.

The first electrode layer 102 can be a suitable metal conductor for a memory cell. Examples can include aluminum, copper, tungsten, titanium, silver, platinum, palladium, other suitable compounds thereof, or a suitable combination of the foregoing. In at least one aspect, metal electrode layer 104 can be a metal bitline, metal wordline, metal dataline, etc. of a memory array. For instance, metal electrode layer 104 can be a metal bitline or metal wordline in a fundamental crossbar memory array. The first electrode layer 102 can be connected to a sensing circuit (e.g., CMOS circuitry, not depicted) to measure current or voltage of cell 100 in conjunction with reading a state of cell 100, for example.

In one or more embodiments, memory cell 100 can comprise one or more other layers not depicted at FIG. 1. For instance, an intermediary layer(s) can be instituted adjacent to one or more of the layers depicted at memory cell 100. As one example, a suitable material layer that mitigates or controls unintended oxidation of switching medium 106 can be positioned between one or more layers of memory cell 100, such as between second electrode layer 104 and switching medium 106. As another example, in some embodiments, memory cell 100 can have fewer layers than depicted in FIG. 1. For instance, second electrode layer 104 or first electrode layer 102 can be removed, and switching material 106 or doped semiconductor layer 108 can electrically contact a conductive bitline, wordline, data line, source line, etc., of a memory array. Accordingly, it is to be appreciated that suitable variations of memory cell 100 known in the art or made known to one of ordinary skill in the art by way of the context provided herein are considered within the scope of the present disclosure.

Figure 2:
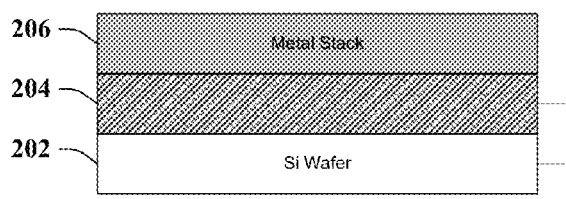
FIG. 2 illustrates a schematic diagram of an example memory cell at a step in a fabrication process in accordance with various aspects described herein.

Turning now to FIG. 2, illustrated is a schematic diagram 200 of an example memory cell (e.g., memory cell 100) at a step in a fabrication process in accordance with various aspects of the disclosure. A layer of silicon oxide or other contact material layer 204 (e.g. field oxide, $SiO_2$) is formed or deposited over a silicon wafer 202. The silicon wafer 202 forms a semiconductor substrate for the memory cell that is to be fabricated. A metal stack 206 is formed on top of the field oxide layer 204. The metal layer can be at least one of Ti, TiN, Al, W, or TiW. In various embodiments, the silicon wafer 202 can include multiple complementary metal-oxide-semiconductor (CMOS) devices.

Figure 3:
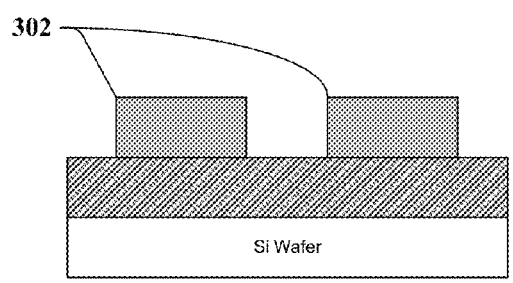
FIG. 3 illustrates a schematic diagram of an example memory cell at a step in a fabrication process in accordance with various aspects described herein.

FIG. 3 illustrates a schematic diagram 300 of an example memory cell at a step in a fabrication process in accordance with various aspects described herein. Diagram 300 depicts a memory cell (e.g. memory cell 100) at a step in the fabrication process where metal lines 302 are patterned or etched from the metal stack 206. These metal lines 302 are interconnected with the bottom electrode of the memory cell. In an embodiment of the subject disclosure, the metal lines 302 run in a direction perpendicular to the perspective of the drawing (i.e., into and out of the page).

Figure 4:
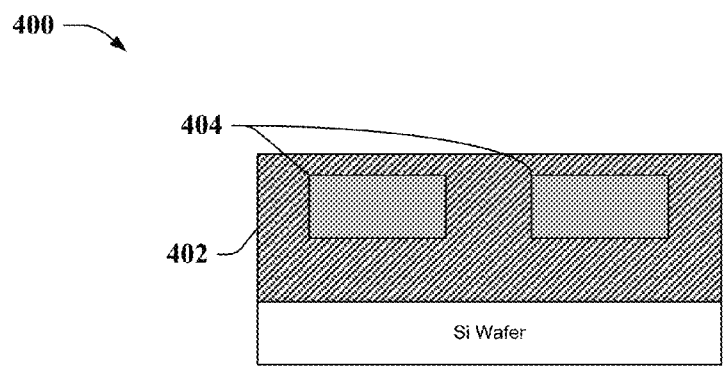
FIG. 4 illustrates a schematic diagram of an example memory cell at a step in a fabrication process in accordance with various aspects described herein.

FIG. 4 illustrates a schematic diagram 400 of an example memory cell at a step in a fabrication process in accordance with various aspects described herein. Diagram 400 depicts a memory cell (e.g. memory cell 100) at a step in the fabrication process where field oxide 402 is layered around the metal lines 404 and overfilled, such that the field oxide 402 covers the metal lines 404.

Figure 5:
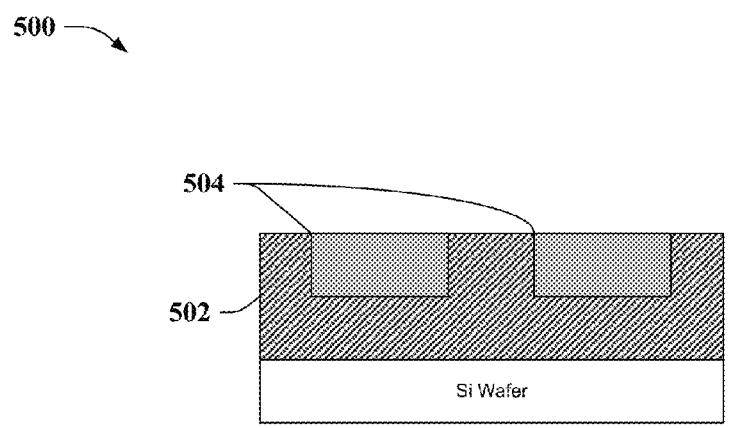
FIG. 5 illustrates a schematic diagram of an example memory cell at a step in a fabrication process in accordance with various aspects described herein.

FIG. 5 illustrates a schematic diagram 500 of an example memory cell at a step in a fabrication process in accordance with various aspects described herein. Diagram 500 depicts a memory cell (e.g. memory cell 100) at a step in the fabrication process where after the field oxide layer 402 (as shown in FIG. 4) was gapfilled between the metal lines 404, in FIG. 5, the field oxide layer 502 was planarized down to the metal lines 504. In an embodiment, the planarization can be performed using chemical mechanical planarization which uses chemical and mechanical processes to smooth surfaces.

Figure 6:
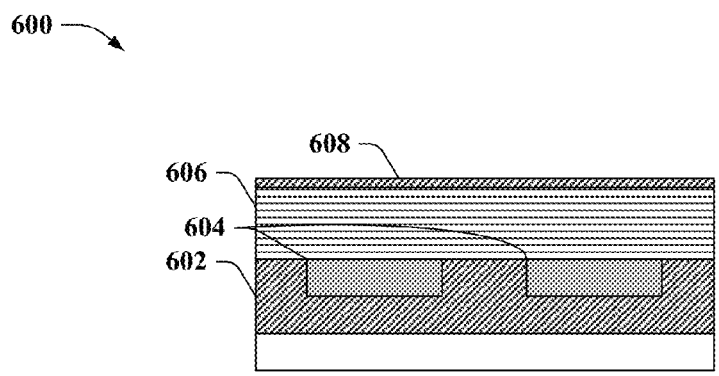
FIG. 6 illustrates a schematic diagram of an example memory cell at a step in a fabrication process in accordance with various aspects described herein.

FIG. 6 illustrates a schematic diagram 600 of an example memory cell at a step in a fabrication process in accordance with various aspects described herein. Diagram 600 depicts a memory cell (e.g. memory cell 100) at a step in the fabrication process where a conducting or semiconducting layer 606 of p doped SiGe or Si is layered over the metal lines 604 and oxide layer 602. In other embodiments, the conducting layer 606 can also be composed of a metal or metal alloy. In another embodiment, a hard mask layer 608 of TEOS (tetraethyl orthosilicate) can also be layered over the conducting or semiconducting layer 606. The layering of the conducting or semiconducting layer 606 can be performed in-situ or following a hydrofluoric dip deposit of i-Si via low pressure chemical vapor deposition, plasma enhanced chemical vapor deposition or physical vapor deposition.

Figure 7:
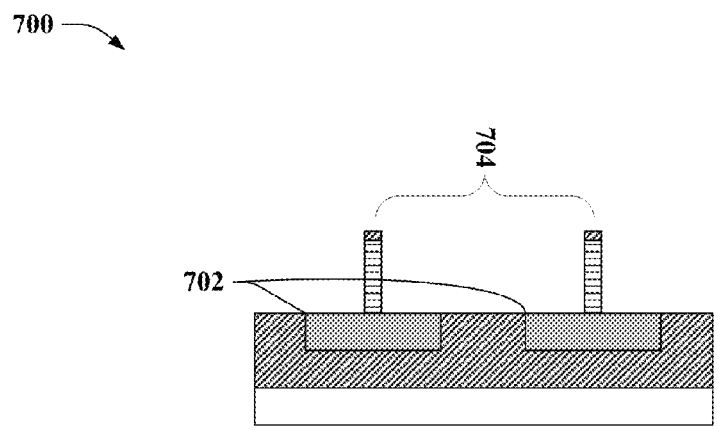
FIG. 7 illustrates a schematic diagram of an example memory cell at a step in a fabrication process in accordance with various aspects described herein.

Turning now to FIG. 7, illustrated is a schematic diagram 700 of an example memory cell at a step in a fabrication process in accordance with various aspects described herein. Diagram 700 depicts a memory cell (e.g. memory cell 100)

at a step in the fabrication process where pillars 704 are etched from the conducting or semiconducting layer 606. These pillars 704 are etched down to the metal lines 702. The pillars, which form a portion of the bottom electrode are the active regions of the two-terminal memory device, in the context of resistive-switching memory, that exhibit a plurality of stable or semi-stable resistive states, each resistive state having a distinct electrical resistance. The pillars 704 thus comprise the switching layer of the memory cell. In various embodiments, the pillars can have a cross section matching a quadrilateral, ovoid, round, or polygonal shape.

Figure 8:
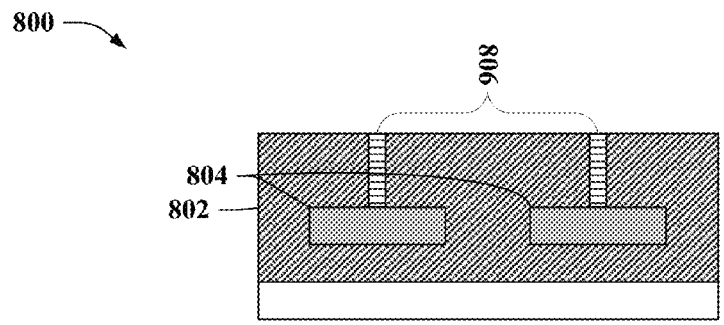
FIG. 8 illustrates a schematic diagram of an example memory cell at a step in a fabrication process in accordance with various aspects described herein.

Turning now to FIG. 8, illustrated is a schematic diagram 800 of an example memory cell at a step in a fabrication process in accordance with various aspects described herein. Diagram 800 depicts a memory cell (e.g. memory cell 100) at a step in the fabrication process where field oxide 402 is layered around the metal lines 404 and overfilled, such that the field oxide 802 is gapfilled around the pillars 806 and metal lines 804. The pillars 806 and field oxide layer 802 can then be planarized via chemical mechanical planarization with field oxide. The planarization process can shorten the pillars, and in various embodiments, an active metal material can be layered as a collar on the top surface of the pillars 806 and field oxide 802.

Figure 9:
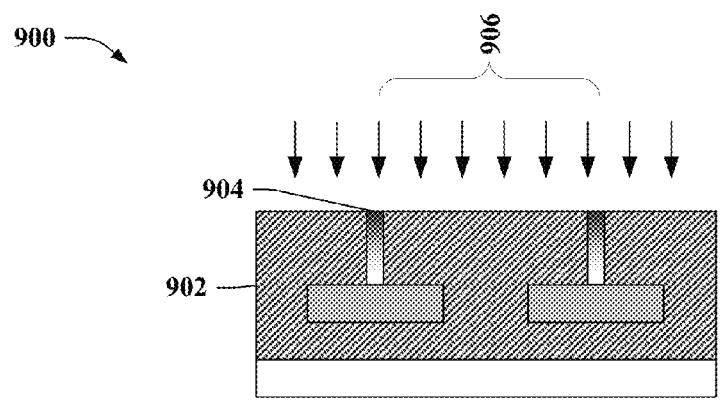
FIG. 9 illustrates a schematic diagram of an example memory cell at a step in a fabrication process in accordance with various aspects described herein.

Turning now to FIG. 9, illustrated is a schematic diagram 900 of an example memory cell at a step in a fabrication process in accordance with various aspects described herein. Diagram 900 depicts a memory cell (e.g. memory cell 100) at a step in the fabrication process where ions 906 are implanted into the pillars 904 and field oxide layer 902. These ions 910 can be of H, O, Si, Ag, or Ar ions, wherein the ions are selected based on what type of material the pillars 904 are made of. The ion implantation is performed in order to modify the switching properties of the pillars 904, and can variously amorphize crystalline material, enhance oxidation, modify the band gap, or modify defectivity of the pillars (e.g. increasing the defects, porosity, or vacancies of the crystalline material). In some embodiments a SiOx material (0>x>2) may be formed in the upper regions of the pillars.

The ion implantation can be performed with different ion implant profiles to alter the density and depth of the implanted ions 906 in the pillars 904. In various embodiments, the implant power profile is generally around or greater than 5 keV, and the implants ions have a density of at least $5 \times 10^{14}$ atoms/cm$^3$.

Figure 10:
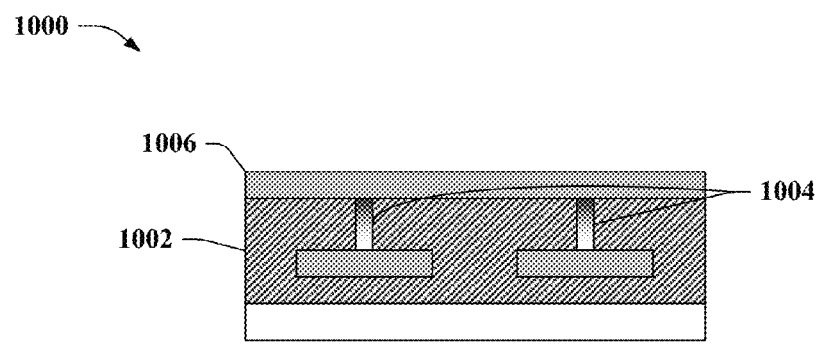
FIG. 10 illustrates a schematic diagram of an example memory cell at a step in a fabrication process in accordance with various aspects described herein.

After the ion implantation is performed, the top metal electrode is formed as shown in FIG. 10. The upper metal layer 1006 is deposited above the oxide 1002 and pillars 1004 at a relatively low temperature of less than 250 degrees centigrade so as to avoid interfering with the ion implantation. The top metal layer 1006 can be formed from one of the active metals described above, e.g. Au, Ag, Pt, etc, in addition to an upper layer of conventional material, e.g. Ti, Ti, TiN, Ag, TiW, W, Al, Cu, combination thereof, etc. Metal lines are shaped from the metal layer 1006 and the metal lines run parallel to the figure. In other words, the metal lines of the top metal electrode run perpendicular to the metal lines of the bottom metal electrode, in various embodiments.

The aforementioned diagrams have been described with respect to interaction between several components of a memory cell, or memory architectures comprised of such memory cells. For example, in some embodiments, the stack of materials may be horizontal, oblique to the substrate, or the like. It should be appreciated that in some suitable alternative aspects of the subject disclosure, such diagrams can include those components and architectures specified therein, some of the specified components/architectures, or additional components/architectures. Sub-components can also be implemented as electrically connected to other sub-components rather than included within a parent architecture. Additionally, it is noted that one or more disclosed processes can be combined into a single process providing aggregate functionality. For instance, a deposition process can comprise a fill or etching process, an anneal process, or the like, or vice versa, to facilitate deposition, filling or etching of memory cell layers by way of an aggregate process. Components of the disclosed architectures can also interact with one or more other components not specifically described herein but known by those of skill in the art.

Figure 11:
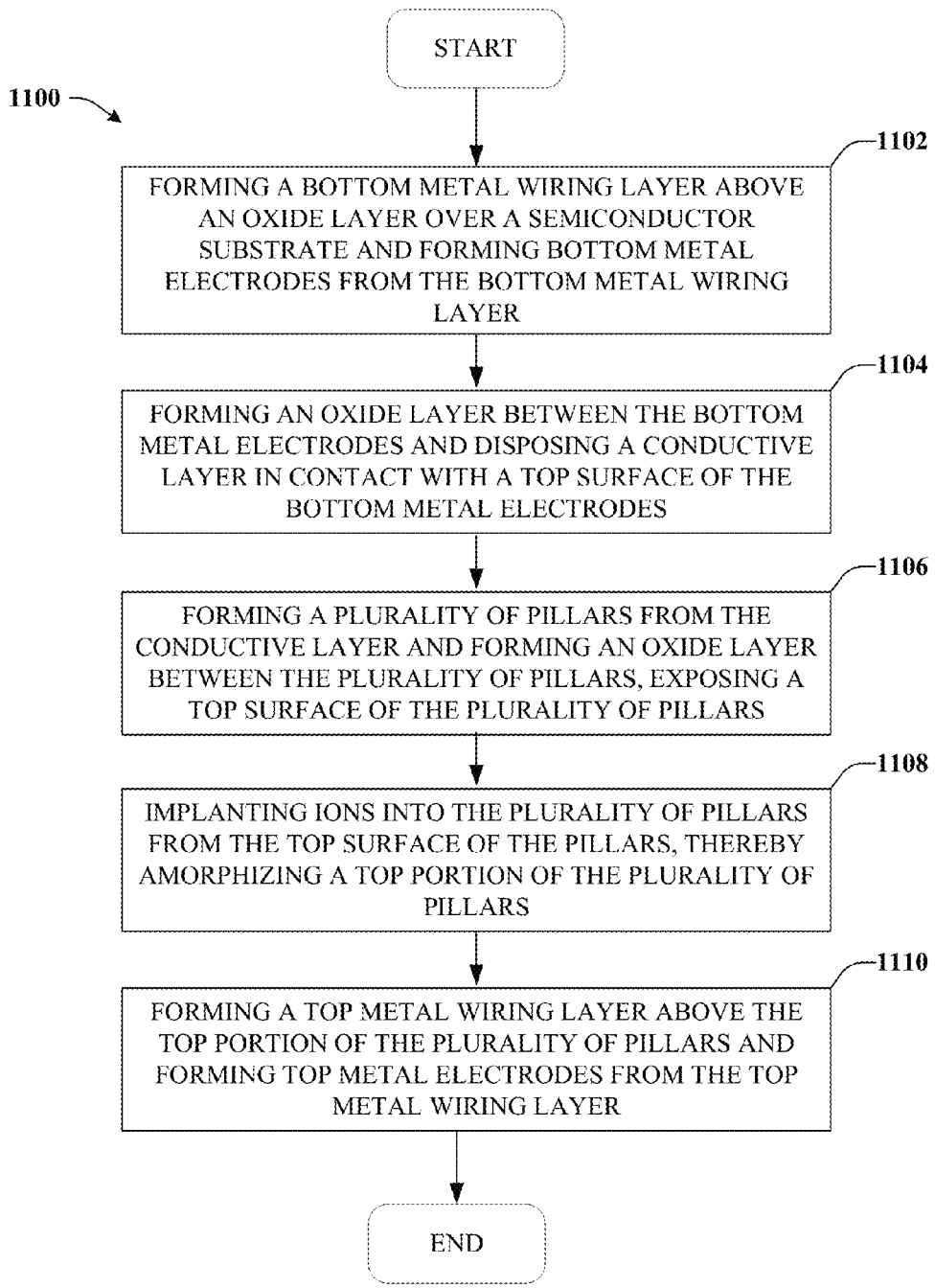
FIG. 11 illustrates a flowchart of an example method for fabricating a two-terminal memory device according to one or more embodiments disclosed herein.

In view of the exemplary diagrams described supra, process methods that can be implemented in accordance with the disclosed subject matter will be better appreciated with reference to the flow chart of FIG. 11. While for purposes of simplicity of explanation, the methods of FIG. 11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any suitable computer-readable device, device in conjunction with a carrier, storage medium, or the like, or a suitable combination thereof.

Turning now to FIG. 11, a flowchart of an example method for transferring data with a configurable page size according to one or more embodiments disclosed herein is illustrated. Flowchart 1100 can begin at 1102, where a bottom metal wiring layer is formed above an oxide layer over a semiconductor substrate. Bottom metal electrodes can also be formed from the bottom metal wiring layer.

At 1104, an oxide layer is formed between the bottom metal electrodes (i.e., gapfilling) and a conductive layer is disposed or formed in contact with a top surface of the bottom metal electrodes. At 1106, a plurality of pillars is formed from the conductive layer, and an oxide layer is formed between the plurality of pillars, exposing a top surface of the plurality pillars.

At 1108, ions are implanted into the plurality of pillars from the top surface of the pillars, thereby amorphizing a top portion of the plurality of pillars. At 1110, top metal wiring layers (e.g. active metal and conductor) are formed above the top portion of the pillars, and top metal electrodes are formed from the top metal wiring layer.

Example Operating Environments

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 12 and 13, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, the inventors have identified several structural, performance, and reliability problems that became evident to them. These or similar considerations can be addressed by some or all of the disclosed aspects.

Figure 12:
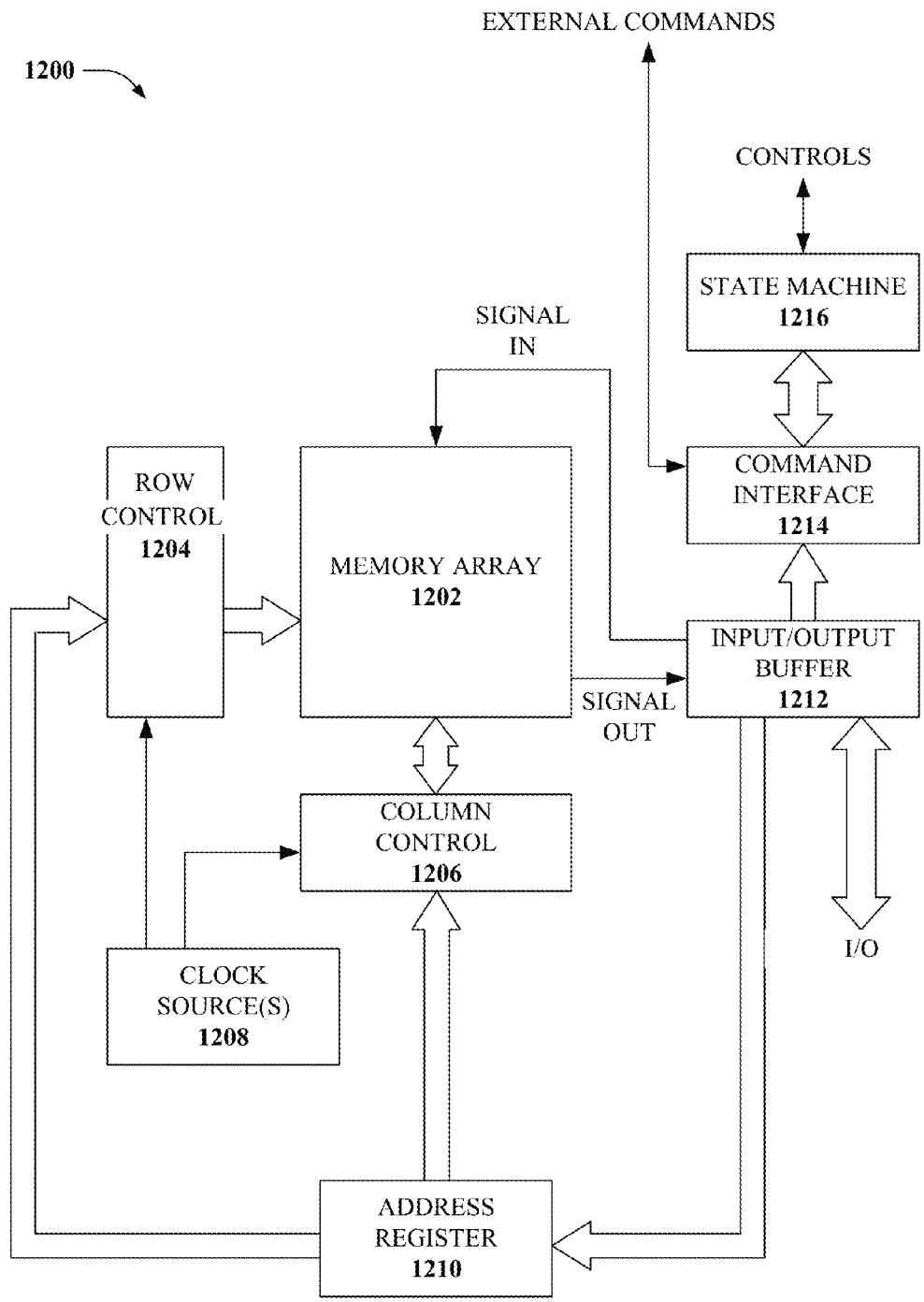
FIG. 12 depicts a block diagram of a sample operating environment for facilitating implementation of one or more aspects disclosed herein.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of electronic memory and process methods for fabricating or operating the electronic memory, those skilled in the art will recognize that the subject disclosure also can be implemented in combination with other components/layers of memory, memory architectures or process methodologies. Moreover, those skilled in the art will appreciate that the disclosed processes can be implemented within a processing system or a computer processor, either alone or in conjunction with a host computer, which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, FLASH memory module, removable memory, or the like. In a distributed computing environment, program modules can be located in both local and remote memory storage modules or devices.

FIG. 12 illustrates a block diagram of an example operating and control environment 1200 for a memory cell array 1202 according to aspects of the subject disclosure. In at least one aspect of the subject disclosure, memory cell array 1202 can comprise a variety of memory cell technology. Particularly, memory cell array 1202 can comprise two-terminal memory such as resistive memory cells with a resistive switching medium formed via ion implantation to a conductive polysilicon material, as described herein.

A column controller 1206 can be formed adjacent to memory cell array 1202. Moreover, column controller 1206 can be electrically coupled with bit lines of memory cell array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of memory cell array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row control 1204 and column control 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted) by way of an I/O buffer or other I/O communication interface. Input/output buffer 1212 can be configured to receive write data, receive an erase instruction, output readout data, and receive address data and command data, as well as address data for respective instructions. Address data can be transferred to row controller 1204 and column controller 1206 by an address register 1210. In addition, input data is transmitted to memory cell array 1202 via signal input lines, and output data is received from memory cell array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of memory cell array 1202. State machine 1216 receives commands from the host apparatus via input/output interface 1212 and command interface 1214, and manages read, write, erase, data input, data output, and like functionality associated with memory cell array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more respective components are fabricated or implemented on separate IC chips.

In connection with FIG. 13, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
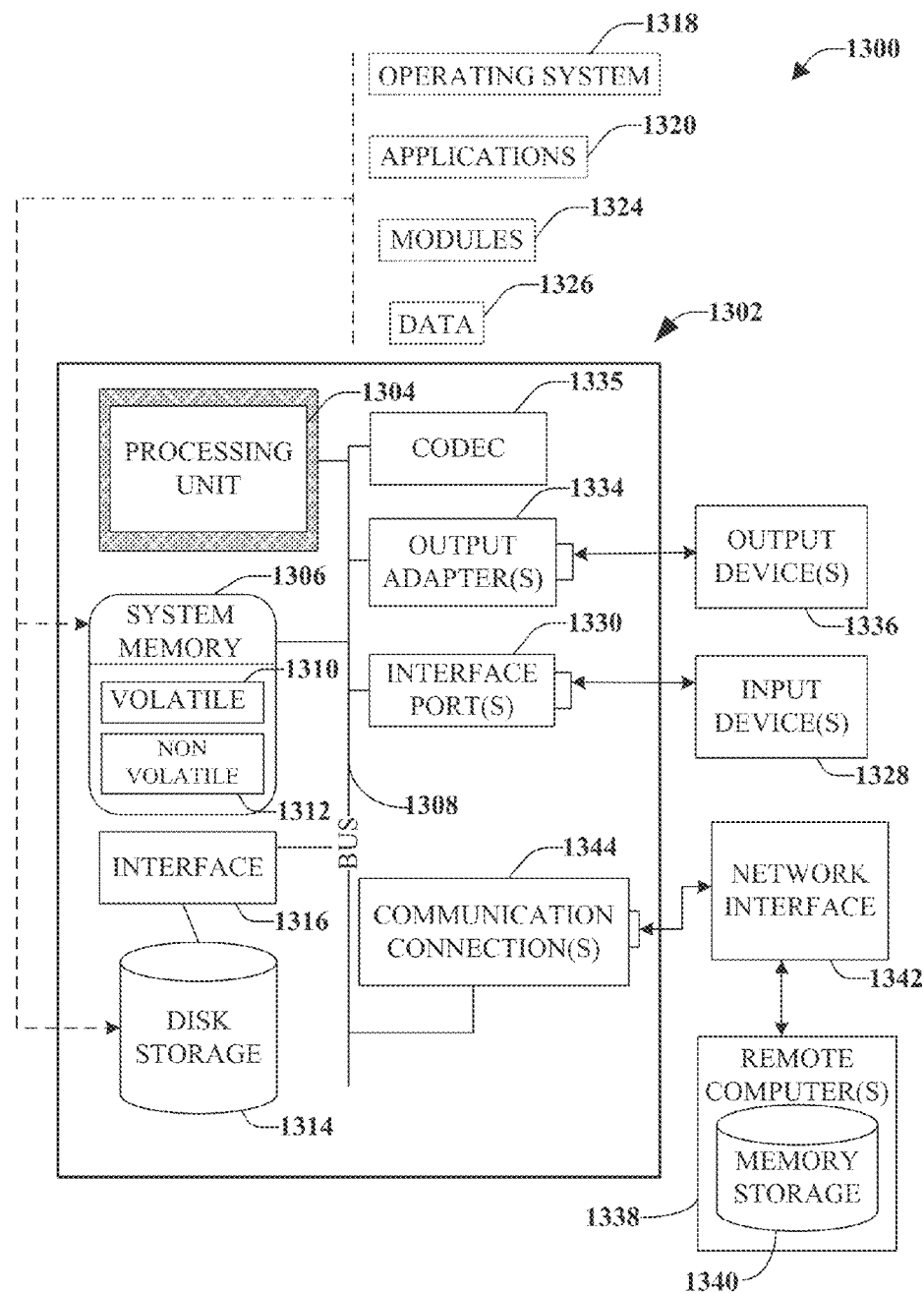
FIG. 13 illustrates a block diagram of an example computing environment that can be implemented in conjunction with various embodiments.

With reference to FIG. 13, a suitable environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1312, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or Flash memory. Non-volatile memory 1312 can employ one or more of the disclosed memory devices, in at least some embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory devices in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM) and so forth.

Computer 1302 may also include removable/non-removable, volatile/non-volatile computer storage medium. FIG. 13 illustrates, for example, disk storage 1314. Disk storage 1314 includes, but is not limited to, devices like a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1314 to the system bus 1308, a removable or non-removable interface is typically used, such as interface 1316. It is appreciated that storage devices 1314 can store information related to a user. Such information might be stored at or provided to a server or to an application running on a user device. In one embodiment, the user can be notified (e.g., by way of output device(s) 1336) of the types of information that are stored to disk storage 1314 or transmitted to the server or application. The user can be provided the opportunity to opt-in or opt-out of having such information collected or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer system 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices 1336 like monitors, speakers, and printers, among other output devices 1336, which require special adapters. The output adapters 1334 include, by way of illustration and not limitation, video and sound cards that provide a means of connection between the output device 1336 and the system bus 1308. It should be noted that other devices or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s)

1344. Network interface 1342 encompasses wire or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1344 refers to the hardware/software employed to connect the network interface 1342 to the bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A two-terminal memory device, comprising:
   a first metal electrode above a first oxide layer over a semiconductor substrate;
   a pillar structure comprising:
      a contact material layer on a top surface of the first metal electrode, wherein the contact material layer is semiconductive; and
      a switching layer on top of the contact material layer, wherein the switching layer comprises a portion of the contact material layer that is ionized, and wherein the switching layer has a lower conductivity than a portion of the contact material layer that is not ionized; and
   a second metal electrode above and in contact with a top surface of the pillar, wherein the second metal electrode comprises:
      an active metal layer in contact with the top surface of the switching layer of the pillar; and
      a conductor layer in contact with the active material.

2. The two-terminal memory device of claim 1, wherein the contact material layer is selected from a group consisting of: doped polysilicon, doped SiGe, or doped siliconcontaining material.

3. The two-terminal memory device of claim 1, the switching layer is selected from a group consisting of: non-conductive amorphous silicon, intrinsic semiconductor material, non-stoichiometric silicon oxide.

4. The two-terminal memory device of claim 1, wherein the active metal layer is selected from a group consisting of: aluminum, copper, tungsten, titanium, silver, platinum, palladium, Ti, TiN, Ag, TiW, and W.

5. The two-terminal memory device of claim 1, wherein the contact material layer is ionized with ions selected from a group consisting of: H, O, Si, Ag, or Ar.

6. The two-terminal memory device of claim 1, wherein the pillar structure is surrounded by an oxide layer.

7. The two-terminal memory device of claim 6, wherein the active material layer comprises a collar of an active metal material above the top surface of the pillar structure.

8. The two-terminal memory device of claim 6, wherein a cross-section of the pillar structure is selected from a group consisting of: a quadrilateral, an ovoid, round, and polygonal.

9. The two-terminal memory device of claim 1, wherein the implanted ions amorphize a structure of the switching layer.

10. The two-terminal memory device of claim 1, wherein the implanted ions comprise an ion implant profile having an implant power of at least 5 keV.

11. The two-terminal memory device of claim 1, wherein the implanted ions have a density of at least $5 \times 10^{14}$ atoms/cm$^3$.

12. The two-terminal memory device of claim 1, wherein the first oxide layer comprises a blanket oxide layer above the bottom metal electrodes that is planarized to expose a top surface of the bottom metal electrodes.

13. The two-terminal memory device of claim 1, further comprising a second oxide layer comprising a blanket oxide layer above the pillar that is planarized to expose a top surface of the pillar.

14. An electronic device comprising an electronic memory unit, the electronic memory unit comprising one or more arrays of multi-state memory cells configured to store information, the multi-state memory cells comprising:
   a first metal electrode above a first oxide layer over a semiconductor substrate;
   a pillar structure comprising:
      a contact material layer formed of a semiconductive contact material on a top surface of the first metal electrode, and a switching layer on top of the contact material layer, wherein the switching layer comprises a portion of the conductive contact material layer that is ionized to decrease conductivity of the switching layer relative to a portion of the contact material layer that is not ionized; and
   a second metal electrode above and in contact with a top surface of the pillar, wherein the second metal electrode comprises:
      an active metal layer in contact with the top surface of the switching layer of the pillar, and a conductor layer in contact with the active metal layer.

15. The electronic device of claim 14, wherein the contact material is selected from a group consisting of: doped polysilicon, doped SiGe, or doped silicon-containing material.

16. The electronic device of claim 14, wherein the switching layer is ionized via ion implantation with an ion implant profile having an implant power of at least 5 keV and wherein the implanted ions have a density of at least $5 \times 10^{14}$ atoms/cm$^3$.

17. The electronic device of claim 14 wherein the active metal layer comprises a material selected from a group consisting of: aluminum, copper, tungsten, titanium, silver, platinum, palladium, Ti, TiN, Ag, TiW, and W.

18. The electronic device of claim 14
   wherein the conductor layer comprises a barrier material layer on top of the active metal layer and a conductive material layer on top of the barrier material layer;
   wherein the barrier material layer is selected from a group consisting of: a tungsten material, a titanium material, and a metal nitride; and wherein the conductive material layer is selected from a group consisting of: aluminum and copper.

19. The electronic device of claim 14 wherein the portion of the conductive contact material layer that is ionized to decrease conductivity is selected from a group consisting of: undoped amorphous silicon, non-stoichiometric silicon oxide, and SiOx.

20. The electronic device of claim 14 wherein the portion of the conductive contact material that is ionized to decrease conductivity contacts the active metal layer.

* * * * *